United States Patent
Babic

(10) Patent No.: US 6,236,671 B1
(45) Date of Patent: May 22, 2001

(54) SYSTEM AND METHOD FOR THE MONOLITHIC INTEGRATION OF A LIGHT EMITTING DEVICE AND A HETEROJUNCTION PHOTOTRANSISTOR FOR LOW BIAS VOLTAGE OPERATION

(75) Inventor: Dubravko I. Babic, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/183,030

(22) Filed: Oct. 29, 1998

Related U.S. Application Data

(63) Continuation-in-part of application No. 09/167,961, filed on Oct. 6, 1998.

(51) Int. Cl.[7] .............................. H01S 5/026; H01L 33/00
(52) U.S. Cl. .......................... 372/50; 257/85; 372/38.02; 372/96
(58) Field of Search ..................... 372/50, 38.02, 372/96; 257/84, 85

(56) References Cited

U.S. PATENT DOCUMENTS

| | | | |
|---|---|---|---|
| 5,541,443 | 7/1996 | Lee et al. | 250/551 |
| 5,892,786 | 4/1999 | Lott | 372/50 |
| 6,097,748 | * 8/2000 | Huang et al. | 372/50 |

FOREIGN PATENT DOCUMENTS

| | | | |
|---|---|---|---|
| 0840380A2 | 5/1998 | (EP) | H01L/31/12 |

OTHER PUBLICATIONS

Lott, J. A., "Design of Vertical Cavity Lasers with Intracavity Photodetectors", Electronics Letter, May 22, 1997, vol. 33, No. 11, pp. 955–957.

Chan, W. K., "Optically Controlled Surface–Emitting Lasers", Applied Physics Letters, vol. 58, No. 21, May 27, 1991, pp. 2342–2344.

* cited by examiner

Primary Examiner—James W. Davie

(57) ABSTRACT

A light emitting device and heterojunction phototransistor combination having a structure where a p-type material terminal of a laser is common with an emitter of a PNP heterojunction phototransistor. This configuration results in a light emitting device and heterojunction phototransistor structure that has a drastically reduced bias voltage requirement and that allows independent biasing of the laser and the heterojunction phototransistor.

4 Claims, 2 Drawing Sheets

SYSTEM AND METHOD FOR THE MONOLITHIC INTEGRATION OF A LIGHT EMITTING DEVICE AND A HETEROJUNCTION PHOTOTRANSISTOR FOR LOW BIAS VOLTAGE OPERATION

CROSS REFERENCE TO RELATED APPLICATION

This application is a continuation-in-part of prior application Ser. No. 09/167,961, filed on Oct. 6, 1998, which is hereby incorporated by reference.

BACKGROUND OF THE INVENTION

1. Field of the Invention

The present invention relates generally to light emitting devices, and, more particularly, to a system and method for the monolithic integration of a light emitting device and a heterojunction bipolar phototransistor (HPT) for extremely low bias voltage operation.

2. Related Art

Semiconductor light emitting devices in general and vertical cavity surface emitting lasers (VCSEL's) in particular are used for many applications including electronics, communication systems, and computer systems. Lasers produce light that can be transmitted directionally. In many applications of lasers, and particularly in many VCSEL applications, there is a need to precisely control the laser output power. The output power of semiconductor lasers is primarily determined by the bias current. However, it can be significantly altered by the ambient temperature and aging of the device. For this reason, control of the output power is realized by monitoring the laser output and adjusting the laser current to maintain a specified laser output power. The light measurement is typically performed using a semiconductor photodetector, a photoconductor, or a phototransistor as the light-detecting device, while the feedback loop is realized using an external electronic circuit. There are numerous implementations of such light-emitting/light-detecting device systems, and they differ in application and performance.

The two primary design issues relating to the laser/light-detector system are the cost of the device and the ability to provide performance required for a specific application. From a cost perspective, it is desirable to build the laser and the light detection device on the same chip using the same or similar fabrication technology. This is realized by monolithic integration of the laser and the light-detector. Monolithic integration implies that the individual laser and light-detector devices are completed jointly at the wafer level. From a performance perspective, there are a number of desired qualities. The light-detector current should track the directional light output from the laser, while minimizing the capture of the omni-directional spontaneous emission. The relationship between the directional laser output power and the light-detector current should be stable and repeatable. For proper operation the light-detector current should be within the range needed by the external analog feedback circuit. The existence of the light-detector and its biasing should have a negligible effect on the operation of, and in particular, the modulation properties of the laser. The laser modulation and biasing should have a negligible effect on the operation of the light-detector.

Lastly, the driver circuit must be considered. In computer communications applications the minimum bias voltage is an issue of increasing importance due to the desire to reduce computer power consumption. Today's computer architectures are using 3.3 volt (V) power supplies having a lower limit of approximately 3.1V. In the future and for other applications it is foreseeable that the power dissipation will be reduced even further requiring even lower bias voltage levels.

A preferable configuration of the laser/light-detector system is one in which the laser and light-detector are independently biased from the same power supply. In order to achieve this result, the power supply voltage must be larger than the laser operating voltage, which depends on the photon energy, and the light-detector operating voltage, which depends upon the light-detector structure, specifically, the photodetector reverse bias, or the phototransistor collector/emitter bias, required for efficient performance. For optical communications, the vertical cavity laser voltages range between approximately one to two volts. The typical photodetector reverse bias voltage is between 0.5 and 1 volt, while a phototransistor may operate with a collector/emitter bias of 1 to 1.5V, depending on the materials used. For other applications these voltages may vary.

An integrated laser and light-detector structure that enables independent biasing of the laser and the light-detector uses the lowest bias voltage. This is achievable by using a four terminal device structure in which two terminals are jointly connected to the power supply, thereby allowing arbitrary relative polarity between the laser and the light-detector. In three terminal monolithically integrated devices, the relative polarity between the laser and the light-detector is not arbitrary due to fabrication limitations.

In the past, light-detecting devices have been integrated with lasers with varying degrees of success. For example, some integration schemes use a photodetector and laser that have been independently fabricated on different chips. The two devices are integrated at the packaging stage, after fabrication, resulting in arbitrary relative polarity between the laser and photodetector. This integration scheme is referred to as "hybrid integration". The primary disadvantage of this approach is that the extra processing step of integrating the photodetector with the laser after fabrication undesirably adds manufacturing cost. Additionally, in many cases the relationship between the photodetector current and the laser output is neither stable nor repeatable, due to the fluctuation in the laser output beam shape.

Another scheme involves monolithic integration of a photodetector and laser where the coupling is realized using side emission, resulting in both three or four terminal devices. The main disadvantage of such devices is that the photodetector or phototransistor does not detect the directional laser output, but predominately captures the omni-directional spontaneous emission.

Finally, another scheme involves the monolithic integration of a laser and a photodetector or a phototransistor where the coupling is realized by top (or bottom) emission, resulting in both three and four terminal devices.

All of the implementations result in either three terminal devices where the laser and the photodetector share a common n-side (cathode) or a common p-side (anode), which as will be shown require a relatively high bias voltage for operation and in which the laser and the photodiode are electrically coupled; or where the laser and the phototransistor share a common ground terminal, which is not compatible with high-speed collector-driven (or drain-driven) electronic circuitry; or in four terminal devices, which are difficult and costly to fabricate.

Therefore, a monolithically-integrated three terminal device that can operate at an extremely low bias voltage, and enables electrical de-coupling between the laser and the photodetector is desired.

Disclosed in copending, commonly assigned U.S. patent application Ser. No. 09/167,961 is a laser and photodetector combination in which a photodiode is used as the laser output monitor device.

SUMMARY OF THE INVENTION

The present invention provides a light emitting device and a heterojunction phototransistor (HPT) in a three-terminal monolithically-integrated structure which enables operating bias voltages that are lower than previously achievable, and provides electrical de-coupling between the light emitting device and the HPT. Although not limited to these particular applications, the system and method of the present invention are particularly suited for monolithically integrating an HPT and a vertical cavity surface emitting laser (VCSEL) in a novel configuration that minimizes power consumption. The system and method for the monolithic integration of a light emitting device and a heterojunction phototransistor for low bias voltage operation can be implemented using a variety of epitaxially grown semiconductor materials having various electrical properties. For example, the material layers to be described below in a preferred and several alternative embodiments can be of either n-type or p-type material without departing from the concepts of the invention.

In architecture, the present invention can be conceptualized as a system for measuring a light output of a light emitting device, comprising a light emitting device having a P terminal and an N terminal. A heterojunction phototransistor (HPT) having a collector and an emitter is optically coupled to the light emitting device. The HPT is of a PNP structure, wherein the P terminal of the light emitting device is commonly connected to the emitter of the PNP HPT. This arrangement allows independent biasing of the light emitting device and the HPT, while reducing the voltage bias requirement.

The present invention may also be embodied as a circuit for measuring a light output of a light emitting device and for allowing a low bias voltage requirement, comprising a light emitting device having a positive terminal and a negative terminal, and a heterojunction phototransistor (HPT) having a collector terminal and an emitter terminal. The positive terminal of the light emitting device and the emitter terminal of the HPT are commonly connected to a power supply, thus allowing the independent biasing of the light emitting device and the HPT, and allowing high-speed modulation control using collector-driven (or drain-driven) electronic circuitry. In addition, this configuration enables lower bias voltage than previously achievable.

The invention has numerous advantages, a few of which are delineated, below, as merely examples.

An advantage of the invention is that it permits the measurement of the light output of a light emitting device in a configuration that significantly reduces the operating bias voltage with respect to prior art.

Another advantage of the invention is that the heterojunction phototransistor and the light emitting device are electrically decoupled, thereby enabling independent biasing of the light emitting device and the heterojunction phototransistor, and eliminating the unnecessary loading of the light emitting device driver circuit by the heterojunction phototransistor parasitic capacitance, thereby improving the high-frequency response of the device.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE PREFERRED EMBODIMENT

The present invention is typically implemented by growing epitaxial material layers having various electrical properties and can be implemented using a variety of substrate and epitaxial growth materials. Furthermore, while described in the context of a vertical cavity surface emitting laser (VCSEL) having a monolithically integrated heterojunction phototransistor, the present invention is applicable to other light emitting structures, for example but not limited to, light emitting diodes (LED's). Furthermore, the current and optical mode confinement in the VCSEL may be accomplished by lateral oxidation, insulating implantation, or other suitable techniques that are known in the art.

In addition, the term light-detector is used to describe what is known in the art as a semiconductor photodetector or a phototransistor.

Figure 1A:
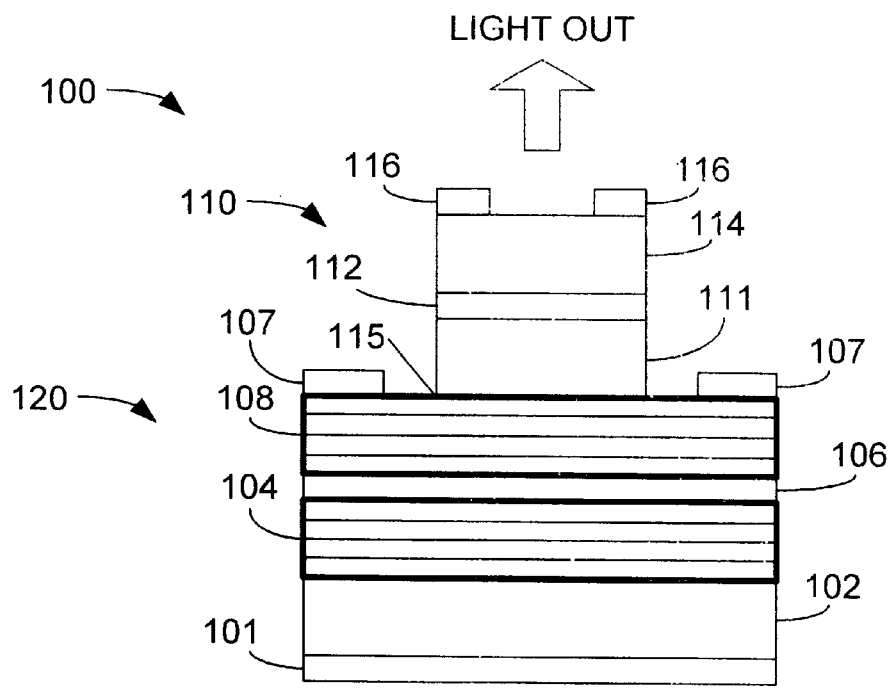
FIG. 1A is a cross-sectional view of a laser and photodetector.

Turning now to FIG. 1A, shown is a cross-sectional view of a laser and photodetector assembly 100 constructed in accordance with that disclosed in commonly assigned copending U.S. patent application Ser. No. 09/167,961. In this embodiment, the photodiode 110 resides over the VCSEL 120.

The foundation of the laser structure 120 is formed with an n-type substrate layer 102, on the bottom of which an n-type contact layer 101 is deposited. N-type bottom mirror 104 is grown over substrate layer 102 and has active region 106 grown thereupon. It should be noted that while illustrated using few layers, the mirror layers referred to are typically comprised of many multiple layers of material and are also referred to as "distributed Bragg reflectors" or "mirrors".

Active region 106 includes n-type material and p-type material surrounding a light amplifying medium. A PN junction is a junction between two layers of different semiconductor conductivity type. The junction may contain any number of low doped or undoped layers, and any number of different materials forming quantum wells or bulk semiconductor layers. The function of the intermediate layers in the active region 106 is to generate and amplify light traversing the junction.

Upon active region 106 is grown p-type top mirror 108, and p-type contact material 107. Upon p-type top mirror 108 is grown the bottom transparent n-type material layer 111 of the photodetector 110. The junction of the p-type top mirror 108 of the VCSEL 120 and the n-type bottom transparent layer 111 of the photodetector 110 forms the second PN junction 115, also referred to as a parasitic PN junction.

A third PN junction of PIN type is formed by the n-type bottom transparent layer 111, absorbing layer 112, and a transparent p-type top layer 114 grown over absorbing layer 112. Upon p-type top layer 114 is deposited p-type contact material layer 116 approximately as shown. The PIN junction type is characterized by any number of low doped or undoped layers, or any number of different materials forming quantum wells or bulk semiconductor layers residing between one p-type and one n-type layer. The function of the intermediate layers in a PIN junction of photodetector 110 is to partially absorb light traversing the junction.

This device arrangement results in a laser and photodetector combination in a PNPN configuration. The PNPN configuration refers to the laser and photodetector structure 100 in which the semiconductor conductivity type alternates three times between p-type material and ntype material when traversing from the substrate layer 102 to the top surface of the photodetector 110. Specifically, active layer 106 is a first PN junction having a PIN structure, junction 115 where the laser 120 meets the photodetector 110 is the second PN junction, and absorbing layer 112 is a third PN junction having a PIN structure. This arrangement results in the PNPN configuration mentioned above. The PNPN configuration contemplates a structure in which layers of different semiconductor conductivity type may appear above or below the layers forming the integrated laser and photodetector.

The arrow above laser and photodetector assembly 100 indicates the light output of this preferred embodiment. It should be noted that the material layers can be reversed (i.e., all n-type layers replaced with p-type layers and all p-type layers replaced with n-type layers).

Contact layer 101, which contacts n-type bottom mirror 102, p-type contact layer 107, which contacts p-type top mirror 108, and p-type contact layer 116, which contacts the top transparent p-type material layer 114 of photodetector 110, form three contacts. These three contacts, together with the aforementioned photodetector structure having the n-type bottom layer 111 of photodetector 110, contact the p-type top mirror 108 of VCSEL 120, enable the laser and photodetector to reduce the required bias voltage, the circuitry of which will be described below.

It should be evident that the n-type contact to the active layer 106 may be realized by using a contact deposited directly on the n-type mirror layer 104 at a location distanced laterally from the p-type contact 107, rather than through the substrate 102.

Figure 1B:
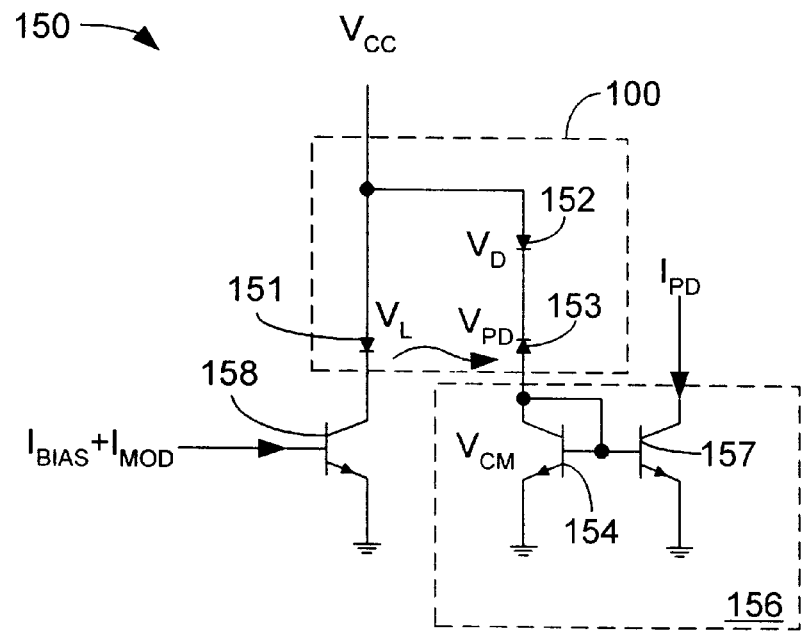
FIG. 1B is a schematic representation of the laser and photodetector of FIG. 1A including exemplary external biasing circuitry associated therewith.

FIG. 1B is a schematic representation 150 of the laser and photodetector 100 of FIG. 1A including simplified external biasing circuitry associated therewith.

Illustratively, the laser and photodetector 100 are shown as diodes 151, 152, and 153 enclosed in the dotted box 100, which represents the laser and photodetector of FIG. 1A. The voltage across diode 151 represents the voltage $V_L$ across VCSEL 120, the voltage $V_D$ across diode 152 represents the forward bias voltage across PN junction 115, and the voltage $V_{PD}$ across diode 153 represents the reverse bias voltage across the photodetector 110 at the photodetector operating current. The simplified laser driver circuit 158 controls the bias current $I_{BIAS}$ and the modulation current $I_{MOD}$ through the laser 120.

The minimum bias voltage necessary for the operation of this circuit is greater than the sum of the smallest individual PN junction operating voltages and can be expressed by the following relationship.

$$V_{CC} > V_D + V_{PD} + V_{CM} \quad \text{(Equation 1)}$$

where $V_D$ is the forward bias voltage of the parasitic PN junction 152 at the photodetector 153 operating current, $V_{PD}$ is the reverse bias on the photodetector 153, and $V_{CM}$ is the forward bias voltage on the transistor 154 in the current mirror circuit 156, formed by transistors 154 and 157. Current mirror 156 measures the current flowing through the photodetector 110, and is shown herein illustratively.

The bias voltage $V_{CC}$ required by laser and photodetector 100 can be lower if the forward bias voltage $V_D$ of the parasitic PN junction across diode 152 is lower than the forward bias voltage $V_L$ of the VCSEL (i.e., $V_D < V_L$), where $V_L$ is the VCSEL forward bias voltage at the laser operating point.

This condition will typically be satisfied for the following reasons. First, the series resistance of the VCSEL 120 is typically larger than the resistance of the parasitic PN junction 115 because of the longer current path in the laser 120. Second, the operating points of VCSEL 120 (containing the first PN junction) and the parasitic PN junction 115 (second PN junction) are different. The laser operates in the range of several milliamperes (mA), while the detector current, which also flows through the parasitic PN junction 115, is generally less than 0.5 mA.

To illustrate with an example, assuming typical values of $V_D \approx 1.2V$, $V_{PD} \approx 0.5V$, and $V_{CM} \approx 0.8V$, has $V_{CC} > 2.5V$. The quoted voltage across the parasitic PN junction 115 ($V_{PD} \approx 1.2V$) is typical of a gallium arsenide homojunction, but can be reduced further by, for example but not limited to, bandgap engineering, i.e., heavy doping, grading, and using other semiconductor materials as known in the art. In addition, $V_{CM} \approx 0.8V$ corresponds to a silicon bipolar transistor and may be greater or less than 0.8V depending upon the transistor used and the material of which the transistor is constructed.

It is important to note that since the laser and the photodetector circuit branches are being biased from the same power supply, the lowest circuit bias voltage $V_{CC}$ is also limited by the sum of the operating voltage of the laser $V_L$ and the voltage on the driver transistor 158.

It should be evident that the embodiment shown in FIG. 1B exhibits the desired relative polarity between the laser and the photodetector within a three-terminal device, which enables the use of a single power supply to simultaneously forward-bias the laser and reverse-bias the photodetector. It should be furthermore evident that in the same configuration the laser current and the photodetector current depend separately on the individual bias conditions of the laser and the photodetector, and are entirely independent of each other. The latter constitutes the electrical de-coupling feature of the laser and the photodetector.

Figure 2A:
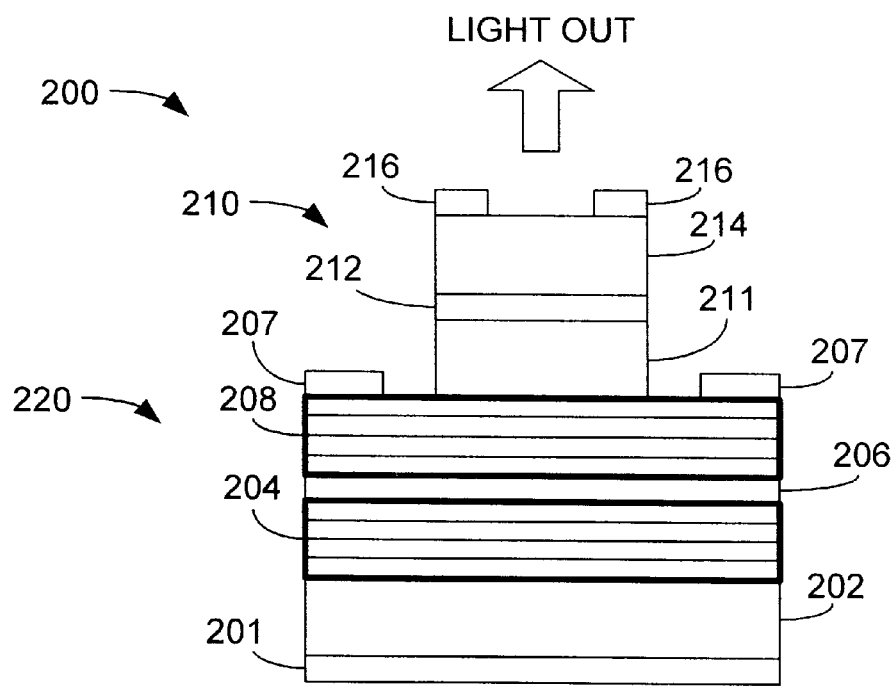
FIG. 2A is a cross-sectional view of a laser and heterojunction phototransistor constructed in accordance with the present invention.

FIG. 2A is a cross-sectional view illustrating a laser and heterojunction phototransistor combination constructed in accordance with the present invention.

The foundation of the laser structure 220 is formed with an n-type substrate layer 202, on the bottom of which an n-type contact layer 201 is deposited. N-type bottom mirror 204 is grown over substrate layer 202 and has active region 206 grown thereupon. It should be noted that while illustrated using few layers, the mirror layers referred to are typically comprised of many multiple layers of material and are also referred to as "distributed Bragg reflectors" or "mirrors".

Active region 206 includes n-type material and p-type material surrounding a light amplifying medium. A PN junction is a junction between two layers of different semiconductor conductivity type. The junction may contain any number of low doped or undoped layers, and any number of different materials forming quantum wells or bulk semiconductor layers. The function of the intermediate layers in the active region 206 is to generate and amplify light traversing the junction.

Upon active region 206 is grown p-type top mirror 208 and p-type contact material 207. In a departure from that described with respect to FIG. 1A, photodiode 110 is replaced with heterojunction phototransistor (HPT) 210. Specifically, upon p-type top mirror 208 is grown the p emitter 211 of HPT 210. Over p emitter 211 is grown n base 212 of HPT 210, and over n base 212 is grown p collector 214. Over p collector 214 is deposited p-type contact material 216.

Note that previously, the two PN junctions (112 and 115 of FIG. 1A) were independent in that there was no minority charge interaction between the two junctions; only majority carrier flow through n-type bottom layer 111 couples the two junctions. In HPT 210, the n base region 212 is sufficiently thin to allow minority carrier flow from the emitter/base junction to the collector/base junction.

By replacing parasitic PN junction 115 and the PN junction (n-type bottom transparent layer 111, absorbing layer 112, and transparent p-type top layer 114) of photodetector 110 with HPT 210, the benefit includes the elimination of parasitic PN junction 115 and leaves only HPT 210 to bias.

In addition, because there is gain present in HPT 210, it may be designed to absorb less light from laser 220 than a detector which has no gain. This is desirable because power absorbed by a light-detector is essentially wasted. To explain, consider that the external control circuit (FIG. 2B) requires a certain range of current from the light-detector (HPT 210) to actively control the laser bias. Hence, the range of light-detector current is set by the external circuit (typically in the range of 50 uA to 500 uA). Light-detector current is directly proportional to the amount of light absorbed from a light emitting device, thus setting the range of light power that is absorbed by the light-detector (one photon generates approximately one electron). If there is gain present in the light detector (i.e., HPT 210) it is possible to generate more electrons (larger current) for each photon absorbed. This enables a light detecting device having gain to be constructed with a thinner absorbing layer, thus absorbing less light to generate the same current than that of a light detector having no gain.

Furthermore, in accordance with the novel configuration presented, by making the p-type contact material 207 of laser 220 common with the emitter 211 of PNP HPT 210 and connecting this terminal to a single positive power supply, it is possible to bias and modulate the laser with NPN driver transistors. This high-speed collector-driven arrangement will be described in detail with reference to FIG. 2B.

The arrow above laser and heterojunction phototransistor assembly 200 indicates the light output of this preferred embodiment. It should be noted that the material layers can be reversed (i.e., all n-type layers replaced with p-type layers and all p-type layers replaced with n-type layers), while still permitting the use of collector driven circuitry.

It should be evident that the n-type contact to the active layer 206 may be realized by using a contact deposited directly on the n-type mirror layer 204 at a location distanced laterally from the p-type contact 207, rather than through the substrate 202.

Figure 2B:
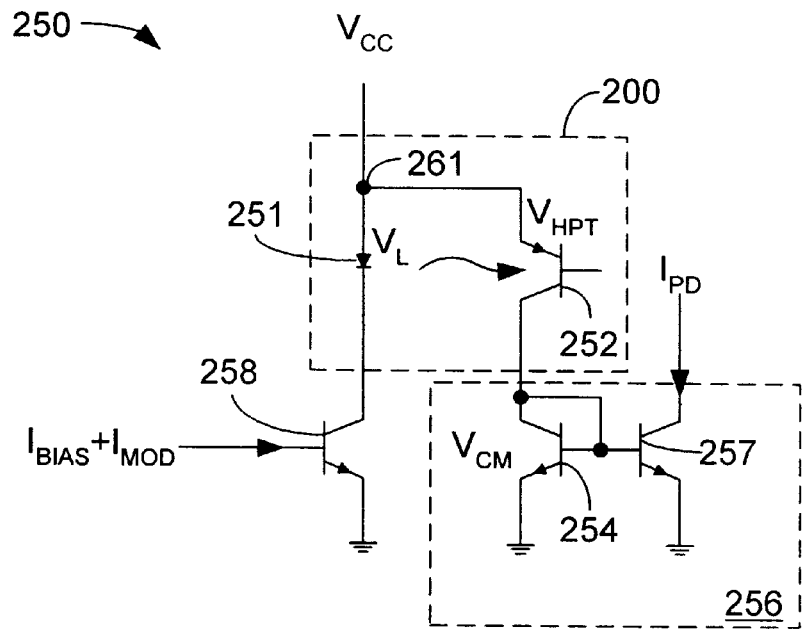
FIG. 2B is a schematic representation of the laser and heterojunction phototransistor of FIG. 2A including simplified external biasing circuitry associated therewith.

FIG. 2B is a schematic representation 250 of the laser and heterojunction phototransistor 200 of FIG. 2A including simplified external biasing circuitry associated therewith.

Illustratively, the laser and heterojunction phototransistor 200 are shown as diode 251 and PNP phototransistor 252 enclosed in the dotted box 200, which represents the laser and heterojunction phototransistor of FIG. 2A. The voltage across diode 251 represents the voltage $V_L$ across VCSEL 220. As can be seen, the voltage $V_D$ across diode 152 (FIG. 1A) and the voltage $V_{PD}$ across diode 153 have been eliminated. In place of diode 152 and diode 153 is PNP heterojunction phototransistor 252, the voltage across which is denoted by voltage $V_{HPT}$. For proper operation of the HPT, it should be biased with a voltage at least as large as its emitter/base voltage. The emitter/base junction self-biases under the presence of light absorption. The typical bias voltages needed to carry a practical collector current in a GaAs/AlGs (Gallium Arsenide/Aluminum Gallium Arsenide) phototransistor are in the range of 1.2V. Hence, the HPT may operate with bias voltages as low as $V_{HPT}>1.2V$.

PNP heterojunction phototransistor 252 is the schematic representation of heterojunction phototransistor 210 of FIG. 2A. The simplified laser driver circuit 258 controls the bias current $I_{BIAS}$ and the modulation current $I_{MOD}$ through the laser 220. Furthermore, by making the p-type contact material 207 of laser 220 (FIG. 2A) common with the emitter 211 of PNP HPT 210 (FIG. 2A), it is possible to bias the structure with NPN driver transistors 258, 254 and 257. The use of NPN driver transistors in the amplifiers allows higher speed operation and higher gain with respect to a PNP configuration. Furthermore, by connecting a terminal 261 that is common to both the laser 220 and the heterojunction phototransistor 210 to the positive power supply $V_{CC}$, the use of an extremely low power supply bias voltage is allowed. In this manner the same low power supply may be applied to diode 251 and phototransistor 252.

Remember, the minimum bias voltage necessary for the operation of this circuit is greater than the sum of the smallest individual PN junction operating voltages and can be expressed by the following relationship.

$$V_{CC}>V_{HPT}+V_{CM} \quad \text{(Equation 2)}$$

The typical values are $V_{HPT}>1.2V$ and $V_{CM}\approx 0.8V$ for a silicon NPN transistor. This indicates that the bias voltage may possibly be as low as 2V. In a system with a 3.1V minimal power supply requirement, more than one volt headroom remains for biasing. In this manner the optimum operating point of the HPT may be determined while still accommodating supply voltage fluctuations. Current mirror 256 measures the current flowing through the heterojunction phototransistor 210, and is shown herein illustratively.

By comparing the preceding example with that shown with reference to FIG. 1B, described above, it can be seen that the bias voltage $V_{CC}$ required by laser and heterojunction phototransistor 200 need only exceed the voltage $V_{CM}$ across current mirror 256. Because the laser and the HPT circuit branches are being biased from the same power supply, the lowest circuit bias voltage $V_{CC}$ is also limited by the sum of the operating voltage of the laser $V_L$ and the voltage on the driver transistor 258.

It should be evident that the embodiment shown in FIG. 2B exhibits the desired relative polarity between the laser and the heterojunction phototransistor within a three-terminal device, which enables the use of a single power supply to simultaneously forward-bias the laser and drive the heterojunction phototransistor. It should be furthermore evident that in the same configuration the laser current and the heterojunction phototransistor current depend separately on the individual bias conditions of the laser and the heterojunction phototransistor, and are entirely independent of each other. The latter constitutes the electrical de-coupling feature of the laser and the heterojunction phototransistor of the present invention.

In addition, because there is gain present in HPT 252, for a given response current measured by the current mirror 256, the HPT 252 can be designed to absorb less light and hence, remove less power from the laser while making a power measurement.

It will be obvious to those skilled in the art that many modifications and variations may be made to the preferred embodiments of the present invention, as set forth above, without departing substantially from the principles of the present invention. For example, the system and method for the monolithic integration of a light emitting device and heterojunction phototransistor for low bias voltage operation can be implemented using various semiconductor technology. Furthermore, while illustrated herein as a phototransistor residing upon a laser structure, the phototransistor may also be grown prior to the laser, and may reside either above or below the laser structure. All such modifications and variations are intended to be included herein within the scope of the present invention, as defined in the claims that follow.

What is claimed is:

1. A system for measuring a light output of a light emitting device, comprising:

a light emitting device having a P terminal and an N terminal; and a heterojunction phototransistor (HPT) monolithically integrated with and optically coupled to said light emitting device, said HPT having a PNP structure including an emitter and a collector, wherein said P terminal of said light emitting device is common with said emitter of said PNP HPT.

2. The system as defined in claim 1, wherein said light emitting device is a vertical cavity surface emitting laser.

3. A circuit for measuring a light output of a light emitting device and for allowing a low bias voltage requirement, comprising:

a light emitting device having a positive terminal and a negative terminal; and a heterojunction phototransistor (HPT) monolithically integrated with said light emitting device and having a collector terminal and an emitter terminal, wherein said positive terminal of said light emitting device and said emitter terminal of said HPT are commonly connected, thus allowing the independent biasing of said light emitting device and said HPT.

4. The circuit as defined in claim 3, further comprising a positive power supply connected to said common connection between said positive terminal of said light emitting device and said emitter terminal of said HPT.

* * * * *